United States Patent
Allen et al.

(10) Patent No.: US 10,991,194 B2
(45) Date of Patent: Apr. 27, 2021

(54) SYSTEMS AND METHODS FOR SYNCHRONOUSLY ILLUMINATING LIGHTING COMPONENTS OF AN ELECTRONIC GAMING MACHINE

(71) Applicant: ARISTOCRAT TECHNOLOGIES AUSTRALIA PTY LIMITED, North Ryde (AU)

(72) Inventors: Santiago Allen, Henderson, NV (US); Bretton Maddux, Henderson, NV (US); Natalie Bugel, Las Vegas, NV (US); Abigail Habdas, Las Vegas, NV (US)

(73) Assignee: Aristocrat Technologies Australia Pty Limited, North Ryde (AU)

( * ) Notice: Subject to any disclaimer, the term of this patent is extended or adjusted under 35 U.S.C. 154(b) by 40 days.

(21) Appl. No.: 16/577,744

(22) Filed: Sep. 20, 2019

(65) Prior Publication Data

US 2020/0111286 A1    Apr. 9, 2020

Related U.S. Application Data

(60) Provisional application No. 62/741,598, filed on Oct. 5, 2018.

(51) Int. Cl.
*G07F 17/32* (2006.01)
*H05K 5/02* (2006.01)

(52) U.S. Cl.
CPC ...... *G07F 17/3211* (2013.01); *G07F 17/3216* (2013.01); *G07F 17/3223* (2013.01); *H05K 5/0256* (2013.01)

(58) Field of Classification Search
USPC ............................................. 463/31
See application file for complete search history.

(56) References Cited

U.S. PATENT DOCUMENTS

| | | | |
|---|---|---|---|
| 2005/0014548 A1* | 1/2005 | Thomas | G07F 17/3202 463/16 |
| 2008/0096655 A1* | 4/2008 | Rasmussen | G07F 17/3202 463/31 |
| 2009/0286589 A1* | 11/2009 | Rasmussen | G07F 17/3211 463/20 |
| 2013/0040731 A1* | 2/2013 | Bernard | A63F 13/90 463/30 |
| 2013/0273992 A1* | 10/2013 | Griswold | G07F 17/3211 463/17 |
| 2017/0053478 A1* | 2/2017 | Wudtke | G07F 17/3211 |
| 2017/0228970 A1* | 8/2017 | Bernard | G07F 17/3213 |

* cited by examiner

*Primary Examiner* — Pierre E Elisca
(74) *Attorney, Agent, or Firm* — Armstrong Teasdale LLP

(57) ABSTRACT

An electronic gaming machine includes a cabinet, at least one mechanical reel including at least one reel lighting controller, an edge lighting supported by and extending at least partially around a perimeter of the cabinet, the edge lighting including an edge lighting controller, and a processor configured to: identify an edge lighting delay offset value associated with the edge lighting and a mechanical reel delay offset value associated with the at least one mechanical reel; control the at least one mechanical reel to display an animation via the reel lighting controller; and control at least a portion of the edge lighting to initiate a first pattern at a timing via the edge lighting controller based on a difference between the edge lighting delay offset value and the mechanical reel delay offset value, thereby synchronizing presentation of the first pattern with the animation.

20 Claims, 6 Drawing Sheets

SYSTEMS AND METHODS FOR SYNCHRONOUSLY ILLUMINATING LIGHTING COMPONENTS OF AN ELECTRONIC GAMING MACHINE

CROSS-REFERENCE TO RELATED APPLICATION

This application claims the benefit of U.S. Provisional Application Ser. No. 62/741,598, filed Oct. 5, 2018 and entitled GAMING MACHINE AND METHOD FOR SYNCHRONIZED LIGHTING, which is hereby incorporated by reference in its entirety.

TECHNICAL FIELD

The field of disclosure relates generally to electronic gaming, and more particularly to systems and methods for synchronously illuminating lighting components of electronic gaming machines.

BACKGROUND

Electronic gaming machines (EGMs), or gaming devices, provide a variety of wagering games such as, for example, and without limitation, slot games, video poker games, video blackjack games, roulette games, video bingo games, keno games, and other types of games that are frequently offered at casinos and other locations. Play on EGMs typically involves a player establishing a credit balance by inserting or otherwise submitting money and placing a monetary wager (deducted from the credit balance) on one or more outcomes of an instance, or play, of a primary game, sometimes referred to as a base game. In many games, a player may qualify for secondary games or bonus rounds by attaining a certain winning combination or other triggering event in the base game. Secondary games provide an opportunity to win additional game instances, credits, awards, jackpots, progressives, etc. Awards from any winning outcomes are typically added back to the credit balance and can be provided to the player upon completion of a gaming session or when the player wants to "cash out."

Slot games are often displayed to the player in the form of various symbols arranged in a row-by-column grid, or "matrix," which may define a plurality of symbol positions, and which may be generated by spinning a plurality of reels, each of which may correspond to a respective column of the matrix. Specific matching combinations of symbols along predetermined paths, or paylines, drawn through the matrix indicate the outcome of the game. The display typically highlights winning combinations and outcomes for ready identification by the player. Matching combinations and their corresponding awards are usually shown in a "paytable" that is available to the player for reference. Often, the player may vary his/her wager to included differing numbers of paylines and/or the amount bet on each line. By varying the wager, the player may sometimes alter the frequency or number of winning combinations, the frequency or number of secondary games, and/or the amount awarded.

Typical games use a random number generator (RNG) to randomly determine the outcome of each game. The game is designed to return a certain percentage of the amount wagered back to the player, referred to as return to player (RTP), over the course of many plays or instances of the game. The RTP and randomness of the RNG are fundamental to ensuring the fairness of the games and are therefore highly regulated. The RNG may be used to randomly determine the outcome of a game and symbols may then be selected that correspond to that outcome. Alternatively, the RNG may be used to randomly select the symbols whose resulting combinations determine the outcome. Notably, some games may include an element of skill on the part of the player and are therefore not entirely random.

Many electronic gaming machines include a variety of lighting components. For example, many EGMs include reels, which may be illuminated, as well as, for example, a topper display, which may also be illuminated. Typically, however, although one or more such components may be illuminated during gameplay, it has not been feasible to accomplish rhythmic and other time synchronized lighting effects between components on an EGM. Moreover, it has not been feasible to synchronize music that may be played by the EGM as part of the games being played on the EGM with lighting effects on the EGM.

BRIEF DESCRIPTION

In one aspect, an electronic gaming machine is provided. The electronic gaming machine includes a cabinet. The electronic gaming machine also includes at least one mechanical reel supported by the cabinet. The at least one mechanical reel includes at least one reel lighting controller. The electronic gaming machine further includes an edge lighting supported by and extending at least partially around a perimeter of the cabinet. The edge lighting includes an edge lighting controller. The electronic gaming machine also includes a processor configured to execute instructions stored in a memory. The instructions, when executed, cause the processor to identify an edge lighting delay offset value associated with the edge lighting and a mechanical reel delay offset value associated with the at least one mechanical reel. The instructions also cause the processor to control the at least one mechanical reel to display an animation via the reel lighting controller. The instructions further cause the processor to control at least a portion of the edge lighting to initiate a first pattern at a timing via the edge lighting controller based on a difference between the edge lighting delay offset value and the mechanical reel delay offset value, thereby synchronizing presentation of the first pattern with the animation.

In another aspect, a tangible, non-transitory, computer-readable storage medium is provided. The storage medium has instructions stored thereon, which when executed by a processor, cause the processor to receive, in an application programming interface (API) call from an electronic wagering game to a game development kit (GDK), a request to initiate a first lighting pattern on a reel lighting component of an electronic gaming machine and a second lighting pattern to on an edge lighting component of the electronic gaming machine. The instructions also cause the processor to identify an edge lighting delay offset value associated with the edge lighting component and a mechanical reel delay offset value associated with the reel lighting component. The instructions further cause the processor to cause a reel lighting controller to illuminate the reel lighting component in the first lighting pattern. The instructions also cause the processor to cause an edge lighting controller to initiate the second pattern at a timing based on a difference between the edge lighting delay offset value and the mechanical reel delay offset value. The first lighting pattern illuminated on the at least one reel is time synchronized with the second lighting pattern illuminated on the at least the portion of the edge lighting, and whereby the first lighting pattern and the second lighting pattern appear to change in unison.

In yet another aspect, a computer-implemented method is provided. The method includes causing, by a processor, an animation to be displayed on at least one display device of at least one mechanical reel of an electronic gaming machine. The method also includes identifying, by the processor, a delay offset value associated with lighting component of an electronic gaming machine relative to the at least one display device. The method further includes causing, by the processor, the lighting component to initiate a first pattern at a timing based on the delay offset value, thereby synchronizing presentation of the first pattern with the animation.

BRIEF DESCRIPTION OF THE DRAWINGS

An example embodiment of the subject matter disclosed will now be described with reference to the accompanying drawings.

DETAILED DESCRIPTION

Embodiments of the present disclosure provide systems and methods for controlling one or more components, such as reels, edge lighting, topper displays, button decks, buttons, audio output devices, and the like, to be synchronously illuminated. More particularly, each of the variety of components to be illuminated may be associated with an illumination latency. When a component is controlled to be illuminated, actual illumination of the component may be delayed by the illumination latency of the component. Further, as illumination latencies of different components may vary, one or more control or timing delays may be imposed to synchronize actual illumination of each of the various components.

As a result, a variety of illumination patterns may be provided on one or more components of an electronic gaming machine. These patterns may vary from one component to the next, but may be time synchronized to produce a variety of aesthetically pleasing rhythmic and other effects. In some embodiments, other sensory outputs may be added in synchrony, such as audio outputs, temperature outputs, and other physical outputs, such as ticket printing, awards of cash prizes (e.g., coin out), and the like. For example, in some embodiments, lighting patterns displayed on one or more components may be synchronized with music played in conjunction with the lighting patterns.

Figure 1:
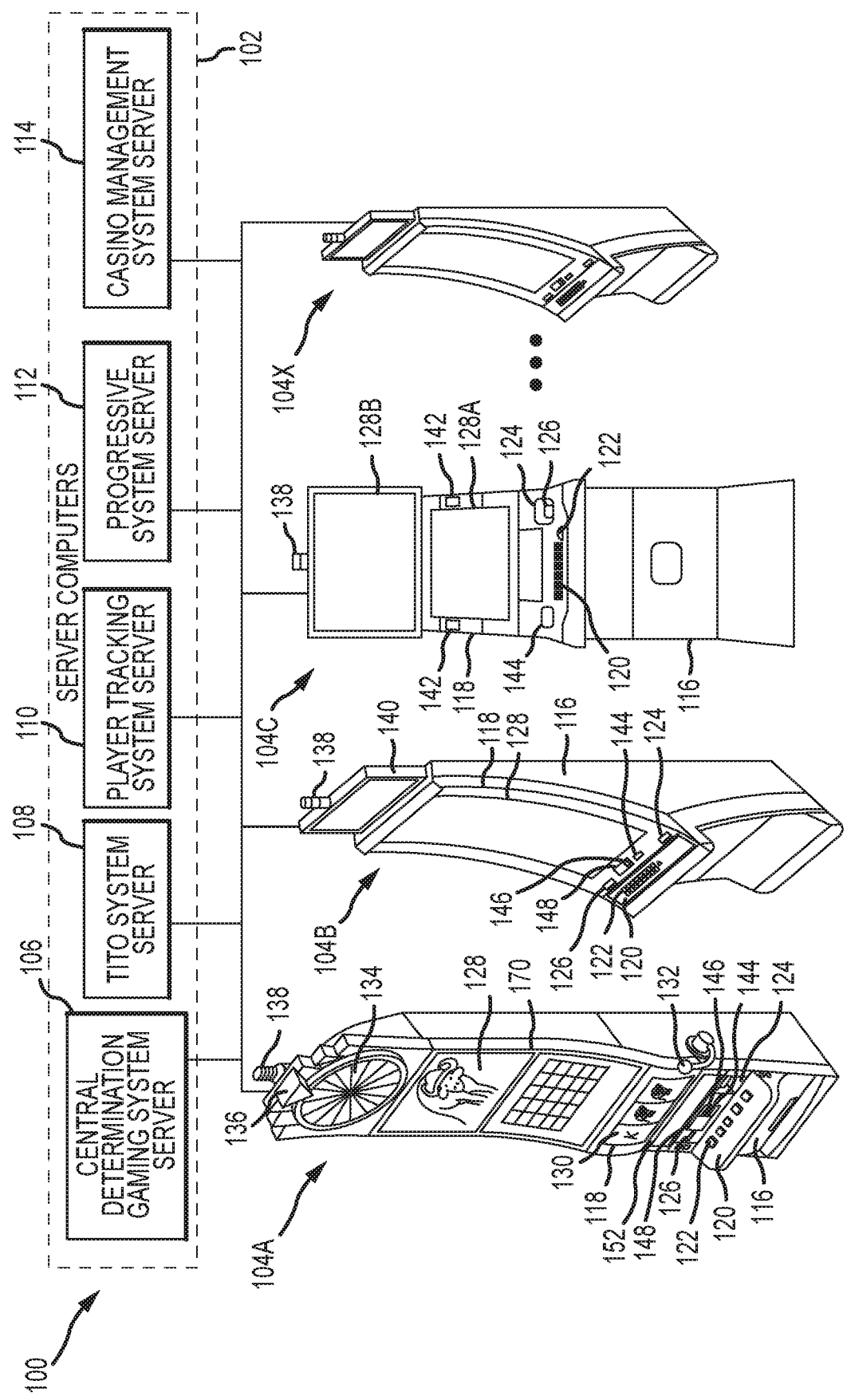
FIG. 1 is a schematic diagram of a plurality of electronic gaming devices (EGMs) networked with various gaming-related servers.

FIG. 1 illustrates several different models of EGMs which may be networked to various gaming related servers. Shown is a system 100 in a gaming environment including one or more server computers 102 (e.g., slot servers of a casino) that are in communication, via a communications network, with one or more gaming devices 104A-104X (EGMs, slots, video poker, bingo machines, etc.) that can implement one or more aspects of the present disclosure. The gaming devices 104A-104X may alternatively be portable and/or remote gaming devices such as, but not limited to, a smart phone, a tablet, a laptop, or a game console, although such devices may require specialized software and/or hardware to comply with regulatory requirements regarding devices used for wagering or games of chance in which monetary awards are provided.

Communication between the gaming devices 104A-104X and the server computers 102, and among the gaming devices 104A-104X, may be direct or indirect, such as over the Internet through a website maintained by a computer on a remote server or over an online data network including commercial online service providers, Internet service providers, private networks, and the like. In other embodiments, the gaming devices 104A-104X may communicate with one another and/or the server computers 102 over RF, cable TV, satellite links and the like.

In some embodiments, server computers 102 may not be necessary and/or preferred. For example, in one or more embodiments, a stand-alone gaming device such as gaming device 104A, gaming device 104B or any of the other gaming devices 104C-104X can implement one or more aspects of the present disclosure. However, it is typical to find multiple EGMs connected to networks implemented with one or more of the different server computers 102 described herein.

The server computers 102 may include a central determination gaming system server 106, a ticket-in-ticket-out (TITO) system server 108, a player tracking system server 110, a progressive system server 112, and/or a casino management system server 114. Gaming devices 104A-104X may include features to enable operation of any or all servers for use by the player and/or operator (e.g., the casino, resort, gaming establishment, tavern, pub, etc.). For example, game outcomes may be generated on a central determination gaming system server 106 and then transmitted over the network to any of a group of remote terminals or remote gaming devices 104A-104X that utilize the game outcomes and display the results to the players.

Gaming device 104A is often of a cabinet construction which may be aligned in rows or banks of similar devices for placement and operation on a casino floor. The gaming device 104A often includes a main door 154 which provides access to the interior of the cabinet. Gaming device 104A typically includes a button area or button deck 120 accessible by a player that is configured with input switches or buttons 122, an access channel for a bill validator 124, and/or an access channel for a ticket-out printer 126.

In at least some embodiments, one or more buttons 122 may be mechanical pushbuttons equipped with display devices, such as small liquid crystal displays (LCDs) and/or light emitting diode (LED) displays. For instance, a mechanical pushbutton may include a player-facing LCD or LED display on a surface thereof that is capable of being controlled to display a variety of animation effects and/or lighting effects. In some cases, mechanical pushbuttons may include an LCD or LED perimeter, which may be controlled to be illuminated, and which may be referred to as a button "halo." More generally, however, mechanical pushbuttons may include a variety of display devices arranged and configured to generate a variety of display and/or illumination effects (both decorative and functional).

In FIG. 1, gaming device 104A is shown as a Relm XL™ model gaming device manufactured by Aristocrat® Technologies, Inc. As shown, gaming device 104A is a reel machine having a gaming display area 118 comprising a number (typically 3 or 5) of mechanical reels 130 with various symbols displayed on them. The reels 130 are independently spun and stopped to show a set of symbols within the gaming display area 118 which may be used to determine an outcome to the game.

In many configurations, the gaming machine 104A may have a main display 128 (e.g., video display monitor) mounted to, or above, the gaming display area 118. The main display 128 can be a high-resolution LCD, plasma, LED, or OLED panel which may be flat or curved as shown, a cathode ray tube, or other conventional electronically controlled video monitor.

In some embodiments, as described in greater detail herein, any of EGMs 104A-104X may include edge lighting 170. Edge lighting 170 may, in turn, include one or more lighting elements, such as one or more light emitting diodes (LEDs), connected in series and/or in parallel to form a string of lighting elements, which may be arranged variously around, over, on, and/or within an EGM 104A-104X. In at least some embodiments, edge lighting 170 may include a string of LEDs arranged around at least a portion of a perimeter of a cabinet, such as main cabinet 116, of an EGM 104A-104X. In some embodiments, edge lighting 170 may be arranged in sections or segments, each of which may be individually controlled, as described herein. In the illustration of FIG. 1, edge lighting 170 extends around main display 128 and reels 130. However, it will be appreciated that edge lighting 170 may be applied in any suitable location and position to achieve a variety of desired (decorative and/or functional) illumination effects.

In some embodiments, the bill validator 124 may also function as a "ticket-in" reader that allows the player to use a casino issued credit ticket to load credits onto the gaming device 104A (e.g., in a cashless ticket ("TITO") system). In such cashless embodiments, the gaming device 104A may also include a "ticket-out" printer 126 for outputting a credit ticket when a "cash out" button is pressed. Cashless TITO systems are well known in the art and are used to generate and track unique bar-codes or other indicators printed on tickets to allow players to avoid the use of bills and coins by loading credits using a ticket reader and cashing out credits using a ticket-out printer 126 on the gaming device 104A. The gaming machine 104A can have hardware meters for purposes including ensuring regulatory compliance and monitoring the player credit balance. In addition, there can be additional meters that record the total amount of money wagered on the gaming machine, total amount of money deposited, total amount of money withdrawn, total amount of winnings on gaming device 104A.

In some embodiments, a player tracking card reader 144, a transceiver for wireless communication with a player's smartphone, a keypad 146, and/or an illuminated display 148 for reading, receiving, entering, and/or displaying player tracking information is provided in EGM 104A. In such embodiments, a game controller within the gaming device 104A can communicate with the player tracking system server 110 to send and receive player tracking information.

Gaming device 104A may also include a bonus topper wheel 134. When bonus play is triggered (e.g., by a player achieving a particular outcome or set of outcomes in the primary game), bonus topper wheel 134 is operative to spin and stop with indicator arrow 136 indicating the outcome of the bonus game. Bonus topper wheel 134 is typically used to play a bonus game, but it could also be incorporated into play of the base or primary game.

A candle 138 may be mounted on the top of gaming device 104A and may be activated by a player (e.g., using a switch or one of buttons 122) to indicate to operations staff that gaming device 104A has experienced a malfunction or the player requires service. The candle 138 is also often used to indicate a jackpot has been won and to alert staff that a hand payout of an award may be needed.

There may also be one or more information panels 152 which may be a back-lit, silkscreened glass panel with lettering to indicate general game information including, for example, a game denomination (e.g., $0.25 or $1), pay lines, pay tables, and/or various game related graphics. In some embodiments, the information panel(s) 152 may be implemented as an additional video display.

Gaming devices 104A have traditionally also included a handle 132 typically mounted to the side of main cabinet 116 which may be used to initiate game play.

Figure 2:
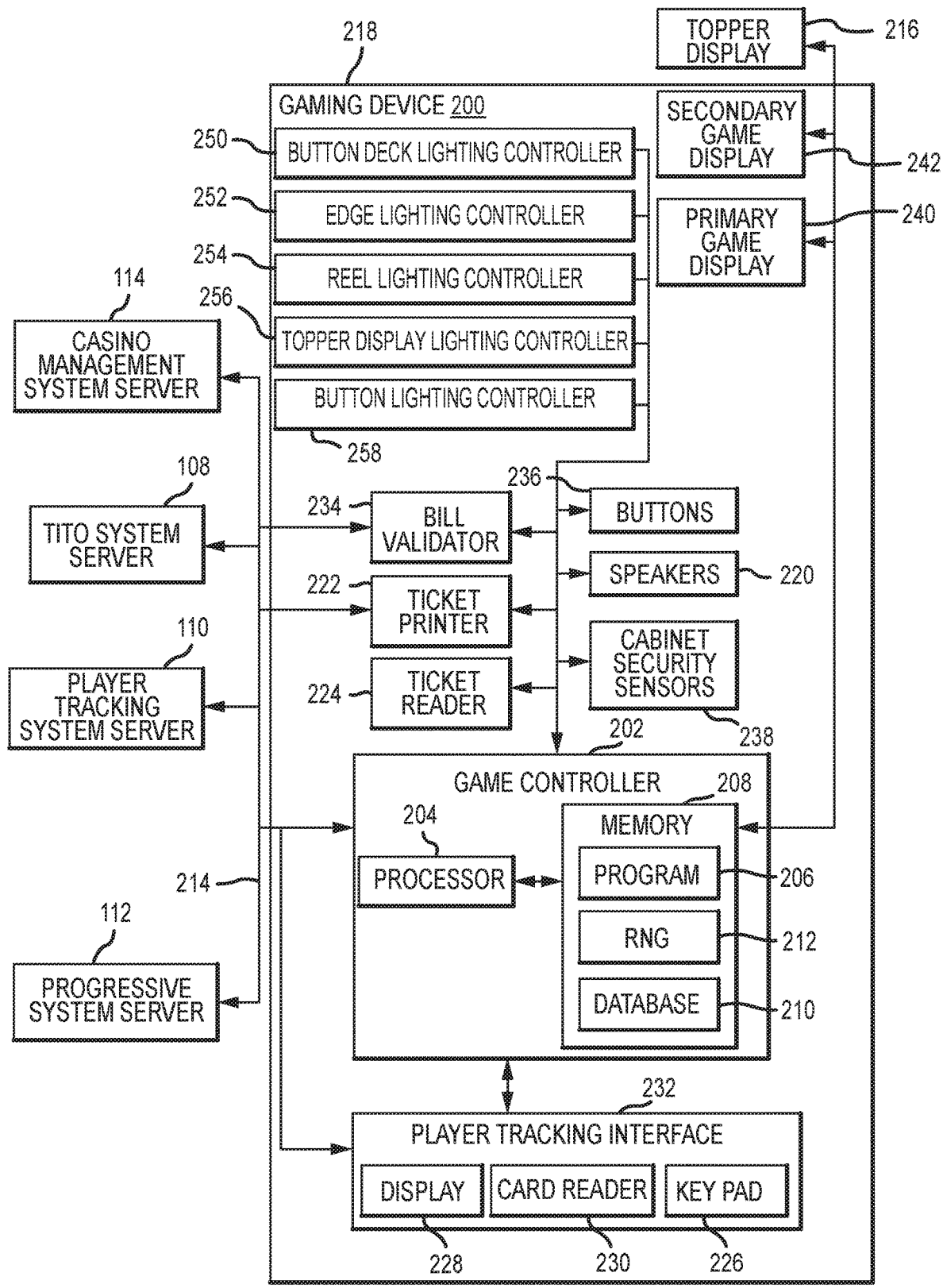
FIG. 2 is a block diagram of an exemplary EGM that includes a plurality of lighting controllers.

Many or all the above described components can be controlled by circuitry (e.g., a gaming controller) housed inside the main cabinet 116 of the gaming device 104A, the details of which are shown in FIG. 2.

Note that not all gaming devices suitable for implementing embodiments of the present disclosure necessarily include top wheels, top boxes, information panels, cashless ticket systems, and/or player tracking systems. Further, some suitable gaming devices have only a single game display that includes only a mechanical set of reels and/or a video display, while others are designed for bar counters or table tops and have displays that face upwards.

An alternative example gaming device 104B illustrated in FIG. 1 is the Arc™ model gaming device manufactured by Aristocrat® Technologies, Inc. Note that where possible, reference numerals identifying similar features of the gaming device 104A embodiment are also identified in the gaming device 104B embodiment using the same reference numbers. Gaming device 104B does not include physical reels and instead shows game play functions on main display 128. An optional topper screen 140 may be used as a secondary game display for bonus play, to show game features or attraction activities while a game is not in play, or any other information or media desired by the game designer or operator. In some embodiments, topper screen 140 may also or alternatively be used to display progressive jackpot prizes available to a player during play of gaming device 104B.

Example gaming device 104B includes a main cabinet 116 including a main door 154 which opens to provide access to the interior of the gaming device 104B. The main or service door 154 is typically used by service personnel to refill the ticket-out printer 126 and collect bills and tickets inserted into the bill validator 124. The main or service door 154 may also be accessed to reset the machine, verify and/or upgrade the software, and for general maintenance operations.

Another example gaming device 104C shown is the Helix™ model gaming device manufactured by Aristocrat® Technologies, Inc. Gaming device 104C includes a main display 128A that is in a landscape orientation. Although not illustrated by the front view provided, the gaming display 128A may have a curvature radius from top to bottom, or alternatively from side to side. In some embodiments, display 128A is a flat panel display. Main display 128A is typically used for primary game play while secondary display 128B is typically used for bonus game play, to show game features or attraction activities while the game is not in play or any other information or media desired by the game designer or operator. In some embodiments, example gaming device 104C may also include speakers 142 to output various audio such as game sound, background music, etc.

Many different types of games, including mechanical slot games, video slot games, video poker, video black jack, video pachinko, keno, bingo, and lottery, may be provided with or implemented within the depicted gaming devices 104A-104C and other similar gaming devices. Each gaming device may also be operable to provide many different games. Games may be differentiated according to themes, sounds, graphics, type of game (e.g., slot game vs. card game vs. game with aspects of skill), denomination, number of paylines, maximum jackpot, progressive or non-progressive, bonus games, and may be deployed for operation in Class 2 or Class 3, etc.

FIG. 2 is a block diagram depicting exemplary internal electronic components of a gaming device 200 connected to various external systems. All or parts of the example gaming device 200 shown could be used to implement any one of the example gaming devices 104A-X depicted in FIG. 1. The games available for play on the gaming device 200 are controlled by a game controller 202 that includes one or more processors 204 and a game that may be stored as game software or a program 206 in a memory 208 coupled to the processor 204. The memory 208 may include one or more mass storage devices or media that are housed within gaming device 200. Within the mass storage devices and/or memory 208, one or more databases 210 may be provided for use by the program 206. A random number generator (RNG) 212 that can be implemented in hardware and/or software is typically used to generate random numbers that are used in the operation of game play to ensure that game play outcomes are random and meet regulations for a game of chance.

Alternatively, a game instance (i.e., a play or round of the game) may be generated on a remote gaming device such as a central determination gaming system server 106 (not shown in FIG. 2 but see FIG. 1). The game instance is communicated to gaming device 200 via the network 214 and then displayed on gaming device 200. Gaming device 200 may execute game software, such as but not limited to video streaming software that allows the game to be displayed on gaming device 200. When a game is stored on gaming device 200, it may be loaded from a memory 208 (e.g., from a read only memory (ROM)) or from the central determination gaming system server 106 to memory 208. The memory 208 may include RAM, ROM or another form of storage media that stores instructions for execution by the processor 204. Note that embodiments of the present disclosure represent an improvement in the art of EGM software/progressives and provide new technology in that they facilitate a cross-game or multi-game determination whether a player may be eligible to participate in a progressive award determination and/or whether to award a progressive jackpot. These embodiments are thus not merely new game rules or simply a new display pattern.

The gaming device 200 may include a topper display 216 or another form of a top box (e.g., a topper wheel, a topper screen, etc.) which sits above cabinet 218. The cabinet 218 or topper display 216 may also house a number of other components which may be used to add features to a game being played on gaming device 200, including speakers 220, a ticket printer 222 which prints bar-coded tickets or other media or mechanisms for storing or indicating a player's credit value, a ticket reader 224 which reads bar-coded tickets or other media or mechanisms for storing or indicating a player's credit value, and a player tracking interface 232. The player tracking interface 232 may include a keypad 226 for entering information, a player tracking display 228 for displaying information (e.g., an illuminated or video display), a card reader 230 for receiving data and/or communicating information to and from media or a device such as a smart phone enabling player tracking. Ticket printer 222 may be used to print tickets for a TITO system server 108. The gaming device 200 may further include a bill validator 234, player-input buttons 236 for player input, cabinet security sensors 238 to detect unauthorized opening of the cabinet 218, a primary game display 240, and a secondary game display 242, each coupled to and operable under the control of game controller 202.

In the example embodiment, gaming device 200 may also include a button deck lighting controller 250, an edge lighting controller 252, a reel lighting controller 254, a topper display lighting controller 256, and/or a button lighting controller 258. For simplicity, as used herein, button lighting controller 250, an edge lighting controller 252, a reel lighting controller 254, a topper display lighting controller 256, and a button lighting controller 258 may be referred to as "lighting controllers" 250-258.

As shown, each lighting controller 250-258 may be communicatively coupled to game controller 202 (e.g., processor 204 of game controller 202). In addition, each lighting controller 250-258 may be communicatively coupled to one or more lighting devices of an EGM 104A-104X to control illumination of the one or more lighting devices.

For example, button deck lighting controller 250 may be connected to and configured to control illumination of button deck 120 of an EGM 104A-104X. Likewise, edge lighting controller 252 may be connected to and configured to control illumination of edge lighting 170 of an EGM 104A-104X. In addition, reel lighting controller 254 may be connected to and configured to control illumination of one or more of reels 130 of an EGM 104A-104X. Similarly, topper display lighting controller 256 may be connected to and configured to control illumination of topper display 216 of an EGM 104A-104X, and button lighting controller 258 may be connected to and configured to control illumination of one or more display devices (e.g., LED or LCD display devices) of buttons 122 of an EGM 104A-104X, as described herein.

Gaming device 200 may be connected over network 214 to player tracking system server 110. Player tracking system server 110 may be, for example, an OASIS® system manufactured by Aristocrat® Technologies, Inc. Player tracking system server 110 is used to track play (e.g., amount wagered, games played, time of play and/or other quantitative or qualitative measures) for individual players so that an operator may reward players in a loyalty program. The player may use the player tracking interface 232 to access his/her account information, activate free play, and/or request various information. Player tracking or loyalty programs seek to reward players for their play and help build brand loyalty to the gaming establishment. The rewards typically correspond to the player's level of patronage (e.g., to the player's playing frequency and/or total amount of game plays at a given casino). Player tracking rewards may be complimentary and/or discounted meals, lodging, entertainment and/or additional play. Player tracking information may be combined with other information that is now readily obtainable by a casino management system.

Gaming devices, such as gaming devices 104A-104X, 200, are highly regulated to ensure fairness and, in many cases, gaming devices 104A-104X, 200 are operable to award monetary awards (e.g., typically dispensed in the form of a redeemable voucher). Therefore, to satisfy security and regulatory requirements in a gaming environment, hardware and software architectures are implemented in gaming devices 104A-104X, 200 that differ significantly from those of general-purpose computers. Adapting general purpose computers to function as gaming devices 200 is not simple or straightforward because of: 1) the regulatory requirements for gaming devices 200, 2) the harsh environment in which gaming devices 200 operate, 3) security requirements, 4) fault tolerance requirements, and 5) the requirement for additional special purpose componentry enabling functionality of an EGM. These differences require substantial engineering effort with respect to game design implementation, hardware components and software.

When a player wishes to play the gaming device 200, he/she can insert cash or a ticket voucher through a coin acceptor (not shown) or bill validator 234 to establish a credit balance on the gamine machine. The credit balance is used by the player to place wagers on instances of the game and to receive credit awards based on the outcome of winning instances. The credit balance is decreased by the amount of each wager and increased upon a win. The player can add additional credits to the balance at any time. The player may also optionally insert a loyalty club card into the card reader 230. During the game, the player views the game outcome on one or more of the primary game display 240 and secondary game display 242. Other game and prize information may also be displayed.

For each game instance, a player may make selections, which may affect play of the game. For example, the player may vary the total amount wagered by selecting the amount bet per line and the number of lines played. In many games, the player is asked to initiate or select options during course of game play (such as spinning a wheel to begin a bonus round or select various items during a feature game). The player may make these selections using the player-input buttons 236, the primary game display 240 which may be a touch screen, or using some other device which enables a player to input information into the gaming device 200.

During certain game events, the gaming device 200 may display visual and auditory effects that can be perceived by the player. These effects add to the excitement of a game, which makes a player more likely to enjoy the playing experience. Auditory effects include various sounds that are projected by the speakers 220. Visual effects include flashing lights, strobing lights or other patterns displayed from lights on the gaming device 200 or from lights behind the information panel 152 (FIG. 1).

When the player is done, he/she cashes out the credit balance (typically by pressing a cash out button to receive a ticket from the ticket printer 222). The ticket may be "cashed-in" for money or inserted into another machine to establish a credit balance for play.

Figure 3:
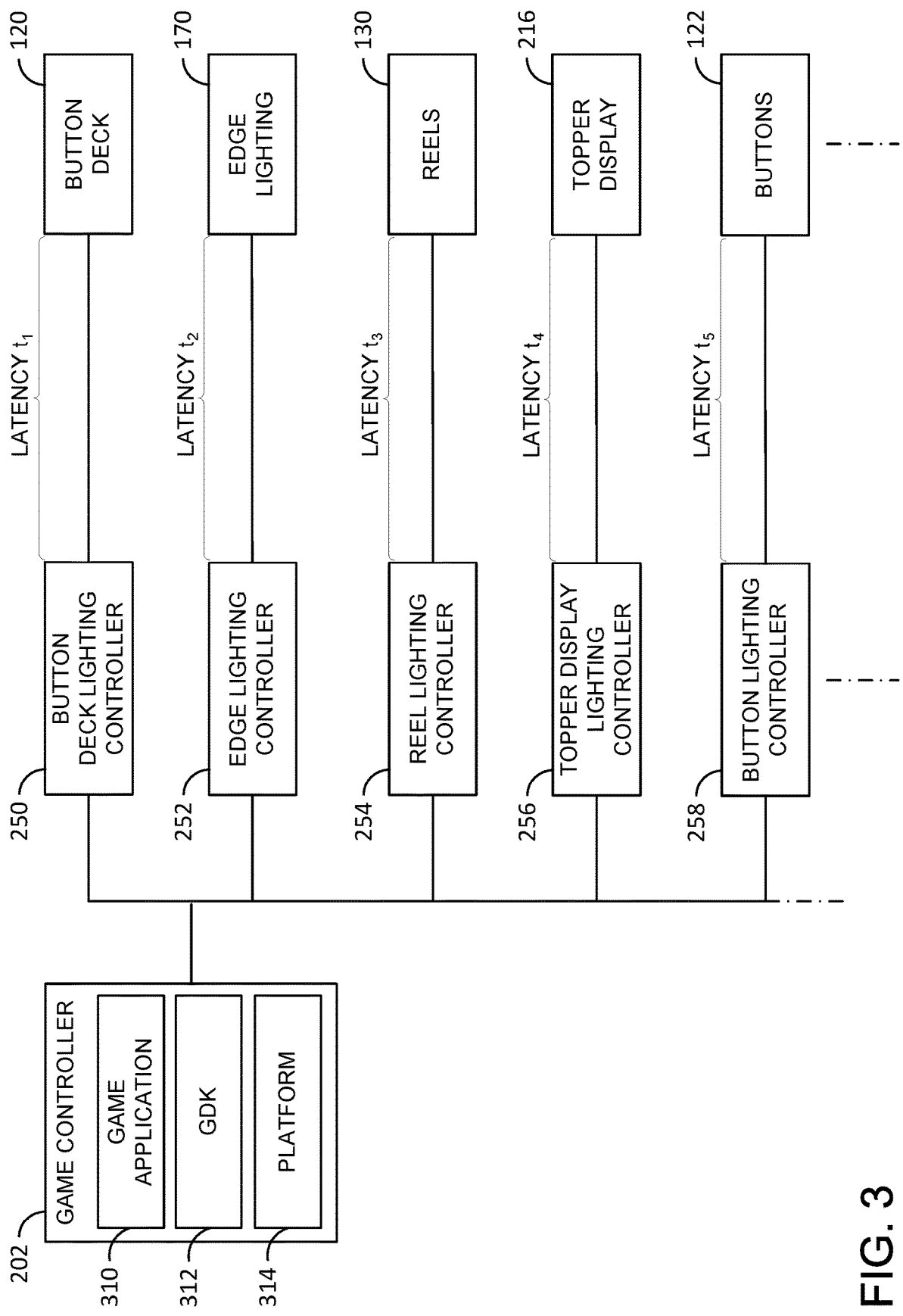
FIG. 3 is a block diagram of the exemplary plurality of lighting controllers shown in the EGM of FIG. 2, in which each lighting controller is coupled to a respective lighting component, and illustrating a latency associated with controlling an illumination of each respective lighting component.

FIG. 3 is a block diagram of the exemplary plurality of lighting controllers 250-258 shown in the EGM 200 of FIG. 2, in which each lighting controller 250-258 is coupled to a respective device or component capable of being illuminated, and illustrating a latency associated with controlling an illumination of each respective device or component. In the example embodiment, the game controller 202 includes a game application 310 that provides graphics and underlying processing of a particular wagering game for display to the player. The game includes digital graphics to be displayed on the display device(s) 240, 242 (e.g., game graphics, user interface elements, and such). Further, the game controller 202 also provides a game development kit (GDK) 312 that is used to provide various game development libraries and hardware-specific tools for game developers. More specifically, the GDK 312 provides libraries that allow the game application 310 to make use of hardware such as the lighting components described herein through control commands sent from the game application 310 to the GDK 312 via application programming interface (API) calls. In turn, the GDK 312 presents outputs (e.g., game animations, lighting animations) on a hardware platform 314 of the game controller 202 via the various lighting controllers 250-258. Each of a variety of devices and/or components, such as any of button deck 120, edge lighting 170, reels 130, topper display 216, and/or buttons 122, may be controlled by a respective lighting controller 250-258. In some embodiments, one or more of the lighting controllers 250-258 may be controlled by separate control systems (not separately shown).

Specifically, as described herein, button deck lighting controller 250 is connected to and configured to control illumination of button deck 120, and edge lighting controller 252 is connected to and configured to control illumination of edge lighting 170. Similarly, reel lighting controller 254 is connected to and configured to control illumination of one or more of reels 130, where reels 130 may include electromechanical and/or mechanical reels having one or more LED and/or LCD display components capable of illuminating or adding an illumination effect to one or more reels 130. In some embodiments, lighting elements, such as LEDs, may be included in a gap or space between adjacent mechanical reels; in these embodiments, reel lighting controller 254 may also controlling illumination of these mid-reel LEDs. Topper display lighting controller 256 is connected to and configured to control illumination of topper display 216, and button lighting controller 258 is connected to and configured to control illumination of one or more display devices (e.g., LED or LCD display devices) of buttons 122.

Further, although a variety of lighting controllers 250-258 are described, in at least some embodiments, game controller 202 may control an illumination or lighting of any of button deck 120, edge lighting 170, reels 130, topper display 216, and/or buttons 122. Similarly, in some embodiments, game controller 202 may control any of these components 120, 170, 130, 216, and 122 indirectly via a respective lighting controller 250-258, such as by providing a control instruction to any of lighting controller 250-258 that causes the controller 250-258 to control an illumination of a connected component 120, 170, 130, 216, and 122. To control an illumination of a connected component, controller 202 or 250-258 may provide a control signal to the component 120, 170, 130, 216, and 122 that causes the component 120, 170, 130, 216, and 122 to be illuminated.

Thus, an illumination of button deck 120, edge lighting 170, reels 130, topper display 216, and/or buttons 122 may be controlled directly by a respective lighting controller 250-258 and/or, in at least some embodiments, indirectly by a respective lighting controller 250-258 via game controller 202. Likewise, in some embodiments, game controller 202 may control illumination of any of any of button deck 120, edge lighting 170, reels 130, topper display 216, and/or buttons 122 directly, in which case, a respective lighting controller 250-258 may be bypassed or excluded from EGM 200.

As a result of one or more electrical, software, and/or hardware properties of each component 120, 170, 130, 216, and 122, there may be some latency between a time that game controller 202 and/or any of lighting controllers 250-258 sends a control instruction or a control signal to illuminate a respective component and a time that the respective component 120, 170, 130, 216, and 122 is actually illuminated. The latency may be small (e.g., in the range of microseconds or milliseconds), but may nonetheless be detectable by the human eye when more than a single component 120, 170, 130, 216, and 122 is controlled to be illuminated. In the illustration of FIG. 3, button deck 120 is associated with a first latency, $t_1$, edge lighting is associated with a second latency, $t_2$, reels 130 are associated with a third latency $t_3$, topper display 216 is associated with a fourth latency, $t_4$, and buttons 122 are associated with a fifth latency, $t_5$.

For example, third latency, $t_3$, associated with illuminating reels 130 may be five milliseconds (5 ms), while second latency, $t_2$, associated with illuminating edge lighting 170 may be 10 milliseconds (10 ms). As a result, if a first control signal to illuminate reels 130 and a second control signal to illuminate edge lighting 170 are generated at a same time, to, reels 130 will be illuminated at $t_{0+5}$, while edge lighting will be illuminated at $t_{0+10}$.

In other words, in this simple example, edge lighting 170 may be illuminated approximately five milliseconds later than illumination of reels 130 occurs. This five millisecond difference between illumination of reels 130 and illumination of edge lighting 170 may be noticeable by the human eye and undesirable, for example, where different lighting effects are displayed to achieve rhythmic or cadenced lighting effects between combinations of components 120, 170, 130, 216, and 122.

Accordingly, to synchronize illumination of reels 130 and illumination of edge lighting 170 (and/or any other component 120, 216, and 122), a delay may be imposed on illumination of one or more components 120, 170, 130, 216, and 122, whereby the differing latencies associated with each component 120, 170, 130, 216, and 122 are compensated, and illumination of two or more components 120, 170, 130, 216, and 122 is time synchronized.

More particularly, to synchronize illumination of two or more components 120, 170, 130, 216, and 122, a latency associated with controlling each component 120, 170, 130, 216, and 122 to be illuminated may be determined (e.g., dynamically by game controller 202 or another lighting controller 250-258, by processor 204, by a server system 106-114, and/or by an engineer during a design phase). For instance, in the example above, third latency, $t_3$, (5 ms) associated with controlling reels 130 to be illuminated may be determined, and a second latency, $t_2$, (10 ms) associated with controlling edge lighting 170 to be illuminated may be determined. It will be appreciated that these latency values are merely illustrative and that other latencies may be determined, depending upon the number of components 120, 170, 130, 216, and 122 to be synchronously illuminated.

After latencies are determined, a delay may be imposed on controlling one or more components 120, 170, 130, 216, and 122 to be illuminated. Specifically, in the example embodiment, illumination of a first component associated with a shorter latency may be delayed by a time difference between the latency of the first component and a latency of a second component, where the second component is associated with a longer latency. To illustrate, with continuing reference to the example above, illumination of reels 130 may be delayed by an interval of 5 ms to cause reels 130 to be illuminated at substantially the same time as edge lighting 170 is illuminated, where the 5 ms delay compensates for the difference between the latency of reels 130 ($t_3$=5 ms) and the latency of edge lighting ($t_2$=10 ms). In at least some embodiments, to delay illumination of a component, such as reels 130, a time delay (e.g., 5 ms) may be added to a control instruction and/or control signal to illuminate the component.

More broadly, where a multiplicity of components 120, 170, 130, 216, and 122 are to be synchronized, each component 120, 170, 130, 216, and 122 may be delayed by a difference between a latency of the respective component 120, 170, 130, 216, and 122 and a latency of the component 120, 170, 130, 216, and 122 associated with the longest latency. As a result, any number of components 120, 170, 130, 216, and 122 may be quickly and dynamically synchronized (or pre-synchronized in the instance that an engineer hard codes or programs one or more time delays).

Figure 4:
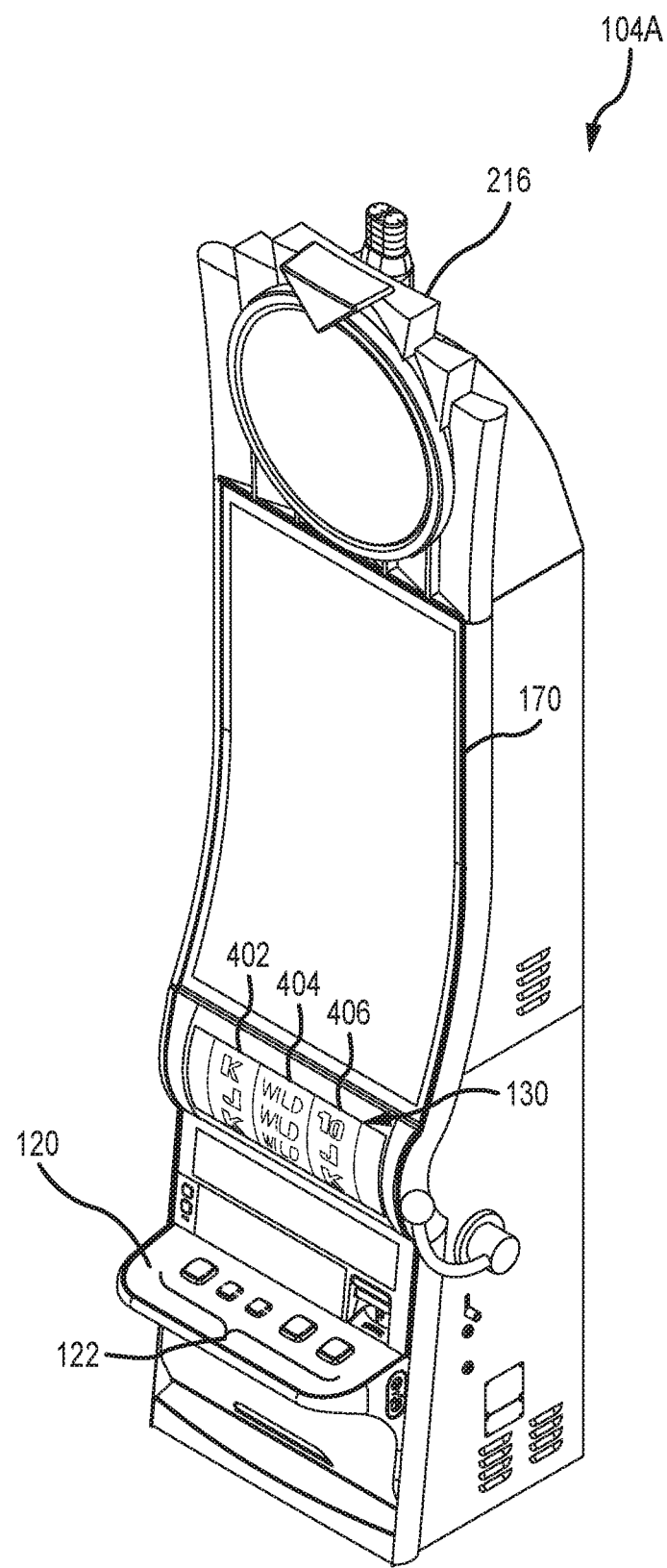
FIG. 4 is a side perspective view of one EGM of the plurality of EGMs shown in FIG. 1 and FIG. 2.
Figure 5:
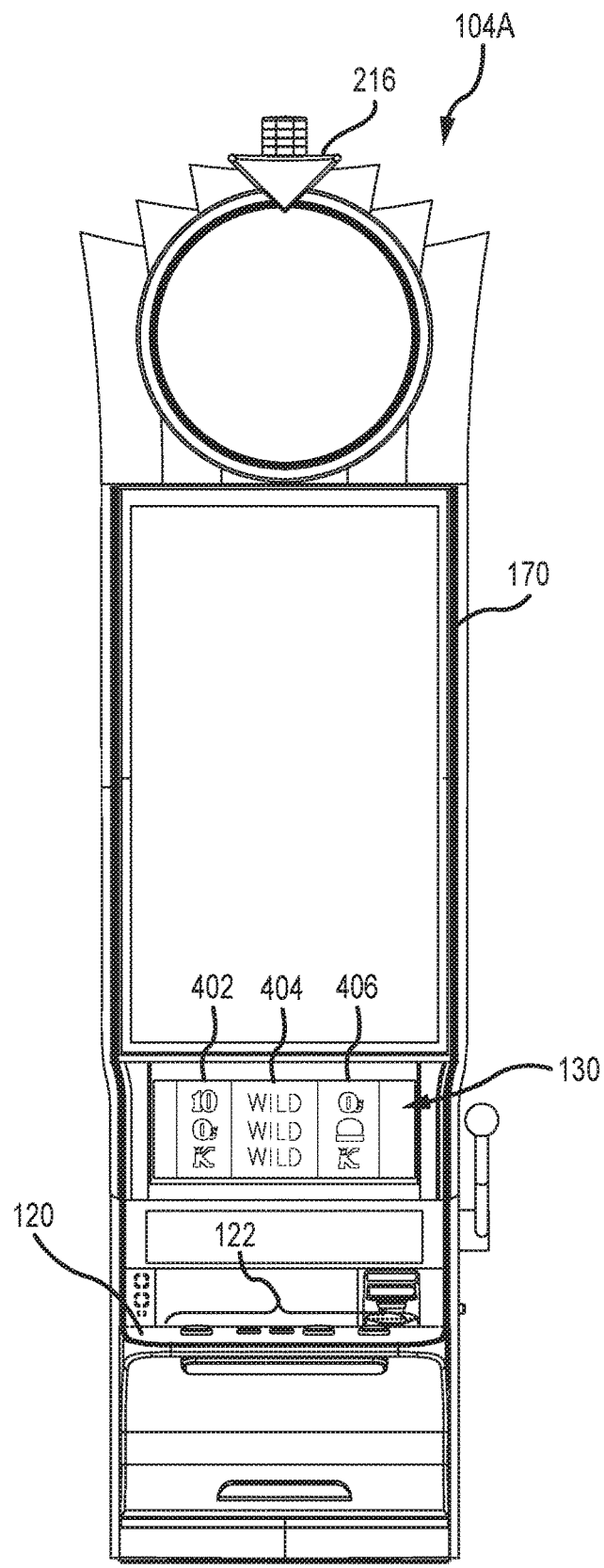
FIG. 5 is a front view of the EGM shown in FIG. 4.

FIG. 4 is a side perspective view of EGM 104A, which includes, as described herein, lighting controllers 250-258, game controller 202, and components 120, 170, 130, 216, and 122. FIG. 5 is a front view of EGM 104A.

In addition to the more general foregoing description, any of EGMs 104A-104X may be controlled to be illuminated in a variety of patterns and using a variety of animations or animation effects. One such example is described below in primary reference to FIGS. 4 and 5 and EGM 104A.

Accordingly, in the example embodiment, at least one reel, such as at least one of a first reel 402, a second reel 404, or a third reel 406 of reels 130, may be controlled to display a first lighting pattern and/or an animation, where the animation, if displayed, may include the first lighting pattern, such as a pulsating or rhythmically expanding and contracting lighting pattern. In some embodiments, an animation may include one or re symbols as well. More generally, it will be appreciated that any of a variety of suitable animations and lighting patterns may be displayed on reels 130 and that all such animations and lighting patterns are within the scope of the present disclosure. Although any of reels 402-406 may be illuminated as described, in the example embodiment, second reel 404 displays the animation and/or first lighting pattern, Likewise, edge lighting 170 (or one or more sections or segments thereof) may be controlled to be illuminated in a lighting second pattern, which may, like the first lighting pattern, include a pulsating or rhythmically expanding and contracting lighting pattern. In one embodiment, second lighting pattern may expand and contract vertically up and down along the sides of EGM 104A. Here again, however, any of a variety of suitable lighting patterns may be displayed, all of which are contemplated by and within the scope of the present disclosure.

As described above, the animation and/or first lighting pattern displayed on reels 402-406 may be associated with a latency, $t_3$, and the second lighting pattern illuminated on edge lighting 170 may be associated with another latency, $t_2$. If these latencies, $t_3$ and $t_2$ are different from one another, the shorter of the two latencies may be increased to match the longer of the two latencies, whereby both of reels 402-406 and edge lighting 170 are illuminated at substantially the same time (or in unison), and whereby no arrhythmic or jerky lighting effect is produced by the combination of reels 402-406 and edge lighting 170.

Rather, the lighting animation and/or first lighting pattern may pulsate or otherwise vary in time in rhythm with the second lighting pattern on edge lighting 170, producing a pleasant visual sensation of synchronized lighting effects occurring on reels 402-406 and edge lighting 170. For example, if second reel 404 displays a pulsating lighting effect that expands and contracts from a center of second reel 404 to an outer perimeter of second reel 404 and back towards the center, edge lighting 170 may be similarly illuminated to pulsate in synchrony with the lighting pulsation occurring on second reel 404.

In addition to synchronizing edge lighting 170 with the animation and/or first lighting pattern illuminated on one or more reels 402-406, as described herein, any of button deck 120, topper display 216, buttons 122, and/or any other illuminable component of EGM 104A may be controlled to be illuminated and time synchronized with the animation or lighting effect occurring on one or more reels 402-406. Similarly, in at least some embodiments, components 120, 170, 130, 216, and 122 may be synchronized with one another as opposed to with an animation or lighting pattern occurring solely on reels 130. For example, edge lighting 170 may be illuminated and synchronized with a lighting occurring on any of button deck 120, buttons 122, and/or topper display 216, irrespective of a lighting pattern or animation displayed on reels 402-406. Thus, a variety of synchronized lighting effects are in fact possible using the systems and methods of the present disclosure.

In addition to the lighting patterns, animations, and lighting effects described above, in at least some embodiments, audio, such as music, may be output by EGM 104A in time with one or more lighting patterns, animations, or lighting effects. For example, a song may be played by one or more speakers 142 of EGM 104A. As with each of the components 120, 170, 130, 216, and 122 described above, speaker 142 may be associated with a brief latency. Accordingly, to ensure synchronization between illumination of one or more components 120, 170, 130, 216, and 122 and speaker 142, a latency associated with each component 120, 170, 130, 216, and 122 that is controlled to be illuminated and speaker 142 may also be compensated in the manner described herein.

In one example, a song may be played during play of a game on EGM 104A, and one or more lighting patterns displayed in a rhythmic pattern that coincides with a beat or a melody of the music. For instance, one or more mid-reel LEDs (as described above) may be controlled to be illuminated in time with a cadence of music being played, whereby the mid-reel LEDs may appear to bounce up and down or fluctuate like a stereo equalizer. Likewise, in some embodiments, one or more lighting patterns may be provided in any other suitable or rhythmic manner to a beat or timing of music played in conjunction with the lighting patterns. In some embodiments, a beat of a particular song may be determined as having a particular interval which causes the song to have peaks at particular times, and game developers may wish to have lighting components flash or pulse with the beat of the song (e.g., brightening with the peaks, dimming between the peaks). If the game controller 202 sends control signals to the lighting component(s) without adjusting for latency, the visual pulse of the lighting may be out of sync with (e.g., be displayed later than) the beat of the song. To combat such issues, the game controller 202 (e.g., the GDK 312, the platform 314) may analyse the audio (e.g., to determine peaks or lulls in the song) and may adjust the timing of control signals sent to lighting based on the timing of the audio and the latencies of associated lighting components. In some embodiments, the game controller 202 may additionally consider a latency between an audio controller (not shown) and the audio output device and may use a difference between the audio latency and the lighting latency to coordinate timing.

In addition to audio output, some EGMs 104A-104X may provide a variety of other types of output, such as, for example haptic feedback (e.g., vibrations), ticket printing functions, temperature output (e.g., hot and cold), and/or a variety of other sensory and physical outputs. In all such cases, a latency associated with providing the desired output may be determined, and the output synchronized, as described herein, with one or more other outputs.

Figure 6:
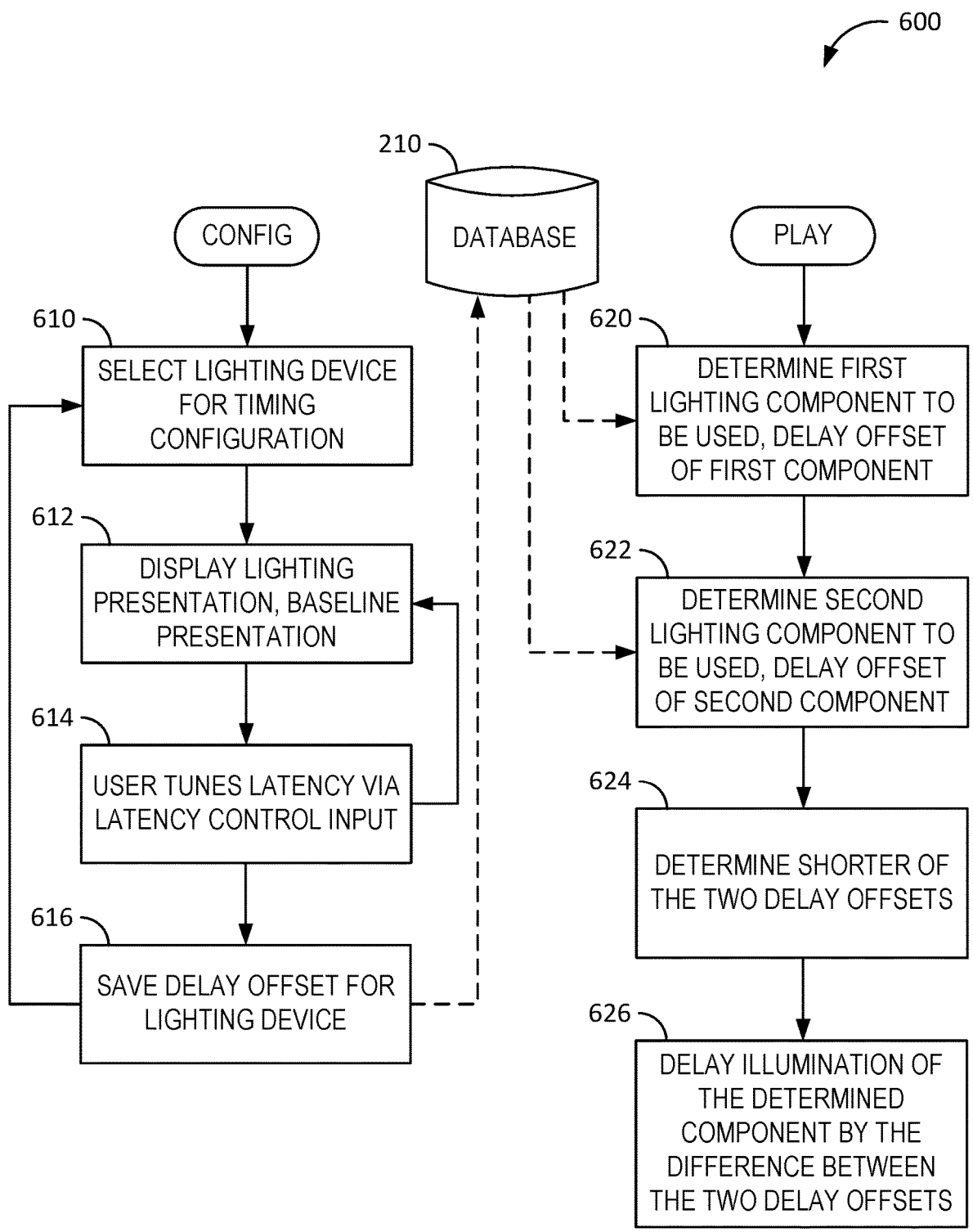
FIG. 6 is a flowchart illustrating a process for synchronously illuminating one or more lighting components of the EGM of FIG. 4 and FIG. 5.

FIG. 6 is a flowchart illustrating and summarizing a process 600 and algorithm, as described in greater detail above, for synchronously illuminating one or more lighting components of an EGM 104A-104X.

In the example embodiment, lighting components of the EGM 104 to be illuminated during game play are initially configured with latency settings based on one or more control component (e.g., the displays 240, 242, the speakers 220). During configuration, a user (e.g., a game developer, a product engineer, or such) is presented with a timing configuration application that allows the user to select a particular lighting component (e.g., button deck 120, edge lighting 170, reels 130, topper display 216, buttons 122, or such) for timing configuration at operation 610. The user may also be allowed to select a particular control component, or the application may use a default control component (e.g., the primary display 240). At operation 620, the timing configuration application simultaneously presents a lighting presentation on the selected lighting component in conjunction with a presentation on the control component. In some embodiments, the user may be allowed to select an animation asset for the selected lighting component for a particular game and may be allowed to also select another animation asset for the control component for that same game, thereby allowing the user to configure the selected lighting component relative to the control component using a specific set of related assets (e.g., two assets with which the user wishes to synchronize during game play). At operation 614, and while displaying the simultaneous presentations on the selected lighting component and control component, presents the user with an input widget (e.g., a knob, slider bar, input box) that allows the user to change a delay offset value associated with the selected lighting component (e.g., by turning the knob, by sliding the slider bar, by editing the input box). The initial delay offset value associated with the selected lighting component may start at zero and may be adjusted up or down by the user. The application cycles through operations 612 and 614, adjusting display of the lighting presentation based on changes in the delay offset made by the user. Once the user is content with the delay offset adjustment made for the lighting component, the application saves the delay offset value for the selected lighting component in the database 210 at operation 616 for later use during game play. The application may return to operation 610 for selection and configuration of another lighting component.

During game play, the EGM 104 uses the saved delay offsets for the lighting components stored in the database 210. More specifically, at operation 620, a first component of EGM 104 to be illuminated (e.g., reels 130) may be determined, and a delay offset (e.g., $t_3$) associated with illuminating the first component may be determined as well. Likewise, at operation 622, a second component of EGM 104 to be illuminated (e.g., edge lighting 170) may be determined, and a delay offset (e.g., $t_2$) associated with illuminating the second component may also be determined. As described above, this process of determining components to be illuminated and their respective latencies may continue until all components to be illuminated are determined. Further, if audio (e.g., music) and/or anything else is to be output, a latency associated with an audio output device (e.g., speaker 142) and/or any other component to provide an output may also be determined.

At operation 624, the delay offsets of each component may be compared to determine which of the components is associated with a longer duration latency and which is associated with a shorter duration latency. In this example, reels 130 are associated with a delay offset of 5 ms, while edge lighting is associated with a delay offset of 10 ms. Accordingly, reels 130 are associated with the shorter duration latency, while edge lighting 170 is associated with the longer duration latency.

Here again, however, the latencies provide are merely illustrative. It will be appreciated that components may be associated with a variety of latencies and that the processes described herein may apply equally irrespective of specific latency values. Further, it will be appreciated that the description of process 600 is simplified, in that only two components (reels 130 and edge lighting 170) are considered. However, the processes described herein may apply to any number of components to be illuminated and/or to provide audio or other output.

Once latencies are determined for each component to be illuminated (or otherwise activated, as described relative to other types of sensory output), illumination or activation of each component may be delayed and/or otherwise time adjusted to compensate for the variations between the latencies associated with each component at operation 626, whereby illumination and/or activation of each component may be synchronized to create a pleasant-feeling, time synchronous or rhythmic player sensation during play of EGM 104A.

Embodiments of the present disclosure thus provide systems and methods for controlling one or more components, such as reels, edge lighting, topper displays, button decks, buttons, audio output devices, and the like, to be synchronously illuminated. More particularly, each of the variety of components to be illuminated may be associated with an illumination latency. When a component is controlled to be illuminated, actual illumination of the component may be delayed by the illumination latency of the component. Further, as illumination latencies of different components may vary, a control or timing delay may be imposed to synchronize actual illumination of each of the various components.

As a result, a variety of illumination patterns may be provided on one or more components of an electronic gaming machine. These patterns may vary from one component to the next, but may be time synchronized to produce a variety of aesthetically please rhythmic and similar effects. In some embodiments, other sensory outputs may be added in synchrony, such as audio outputs, temperature outputs, and other physical outputs, such as ticket printing, awards of cash prizes (e.g., coin out), and the like.

While the invention has been described with respect to the figures, it will be appreciated that many modifications and changes may be made by those skilled in the art without departing from the spirit of the invention. Any variation and derivation from the above description and figures are included in the scope of the present invention as defined by the claims.

What is claimed is:
1. An electronic gaming machine comprising:
a cabinet;
at least one mechanical reel supported by the cabinet, the at least one mechanical reel including at least one reel lighting controller;
an edge lighting supported by and extending at least partially around a perimeter of the cabinet, the edge lighting including an edge lighting controller; and
a processor configured to execute instructions stored in a memory, which when executed cause the processor to at least:
identify an edge lighting delay offset value associated with the edge lighting and a mechanical reel delay offset value associated with the at least one mechanical reel;
control the at least one mechanical reel to display an animation via the reel lighting controller; and
control at least a portion of the edge lighting to initiate a first pattern at a timing via the edge lighting controller based on a difference between the edge lighting delay offset value and the mechanical reel delay offset value, thereby synchronizing presentation of the first pattern with the animation.

2. The electronic gaming machine of claim 1, further comprising a button deck supported by the cabinet, wherein the instructions, when executed, further cause the processor to at least control the button deck to be illuminated in a second pattern, the second pattern selected based upon the animation and time synchronized with the animation.

3. The electronic gaming machine of claim 1, further comprising a topper display supported by the cabinet, wherein the instructions, when executed, further cause the processor to at least control the topper display to be illuminated in a second pattern, the second pattern selected based upon the animation and time synchronized with the animation.

4. The electronic gaming machine of claim 1, wherein to time synchronize the first pattern illuminated on the at least one portion of the edge lighting with the animation displayed on the at least one mechanical reel, the instructions, when executed, further cause the processor to at least:
determine a first latency associated with controlling the at least one mechanical reel to display the animation;
determine a second latency associated with controlling the at least one portion of the edge lighting to be illuminated in the first pattern; and
delay controlling one of the at least one mechanical reel to display the animation or the at least one portion of the edge lighting to be illuminated in the first pattern based upon the first latency and the second latency, whereby the at least one mechanical reel is controlled to begin display of the animation at substantially the same time that the at least one portion of the edge lighting is controlled to be illuminated in the first pattern.

5. The electronic gaming machine of claim 4, wherein the instructions, when executed, further cause the processor to at least:
determine a time difference between the first latency and the second latency; and
delay controlling one of the at least one mechanical reel to display the animation or the at least one portion of the edge lighting to be illuminated in the first pattern based upon the time difference between the first latency and the second latency.

6. The electronic gaming machine of claim 1, wherein the reel lighting controller is communicatively coupled to the processor and configured to control illumination of the at least one mechanical reel, wherein the edge lighting controller is communicatively coupled to the processor and configured to control illumination of the at least one portion of the edge lighting.

7. The electronic gaming machine of claim 6, wherein the instructions, when executed, further cause the processor to at least:
send a first instruction to the reel lighting controller to control the at least one mechanical reel to display an animation; and
send a second instruction to the edge lighting controller to control the at least one portion of the edge lighting to be illuminated in the first pattern.

8. The electronic gaming machine of claim 7, wherein the instructions, when executed, further cause the processor to at least:
delay sending one of the first instruction or the second instruction based upon a first latency associated with controlling the at least one mechanical reel to display the animation and a second latency associated with controlling the at least one portion of edge lighting to be illuminated in the first pattern, whereby the at least one portion of edge lighting is controlled to be illuminated at substantially the same time that the at least one mechanical reel is controlled to begin display of the animation.

9. A tangible, non-transitory, computer-readable storage medium having instructions stored thereon, which when executed by a processor, cause the processor to at least:
receive, in an application programming interface (API) call from an electronic wagering game to a game development kit (GDK), a request to initiate a first lighting pattern on a reel lighting component of an electronic gaming machine and a second lighting pattern to on an edge lighting component of the electronic gaming machine;
identify an edge lighting delay offset value associated with the edge lighting component and a mechanical reel delay offset value associated with the reel lighting component;
cause a reel lighting controller to illuminate the reel lighting component in the first lighting pattern; and
cause an edge lighting controller to initiate the second pattern at a timing based on a difference between the edge lighting delay offset value and the mechanical reel delay offset value, wherein the first lighting pattern illuminated on the at least one reel is time synchronized with the second lighting pattern illuminated on the at least the portion of the edge lighting, and whereby the first lighting pattern and the second lighting pattern appear to change in unison.

10. The storage medium of claim 9, wherein the instructions, when executed, further cause the processor to at least cause the button deck of the electronic gaming machine to be illuminated in a third lighting pattern, the third lighting pattern selected based upon the first lighting pattern and time synchronized with the first lighting pattern.

11. The storage medium of claim 9, wherein the instructions, when executed, further cause the processor to at least cause a topper display of the electronic gaming machine to be illuminated in a third lighting pattern, the third lighting pattern selected based upon the first lighting pattern and time synchronized with the first lighting pattern.

12. The storage medium of claim 9, wherein the instructions, when executed, further cause the processor to at least cause a display device of a mechanical pushbutton of the electronic gaming machine to be illuminated in a third lighting pattern, the third lighting pattern selected based upon the first lighting pattern and time synchronized with the first lighting pattern.

13. The storage medium of claim 9, wherein the instructions, when executed, further cause the processor to at least:
determine a first latency associated with causing the at least one reel to be illuminated in the first lighting pattern;
determine a second latency associated with causing the at least the portion of the edge lighting to be illuminated in the second lighting pattern; and
delay causing one of the at least one reel to be illuminated in the first lighting pattern or the at least the portion of the edge lighting to be illuminated in the second lighting pattern based upon the first latency and the second latency, whereby the at least one reel is caused to begin being illuminated in the first lighting pattern at substantially the same time that the at least the portion of the edge lighting is caused to be illuminated in the second lighting pattern.

14. The storage medium of claim 13, wherein the instructions, when executed, further cause the processor to at least:
determine a time difference between the first latency and the second latency; and
delay causing one of the at least one reel to be illuminated in the first lighting pattern or the at least the portion of the edge lighting to be illuminated in the second lighting pattern based upon the time difference between the first latency and the second latency.

15. The storage medium of claim 9, wherein the instructions, when executed, further cause the processor to at least:
send a first control instruction to a reel lighting controller communicatively coupled to the processor to cause the at least one reel to be illuminated in the first lighting pattern; and
send a second control instruction to an edge lighting controller communicatively coupled to the processor to cause the at least the portion of the edge lighting to be illuminated in the second lighting pattern.

16. A computer-implemented method comprising:
causing, by a processor, an animation to be displayed on at least one display device of at least one mechanical reel of an electronic gaming machine;
identifying, by the processor, a delay offset value associated with lighting component of an electronic gaming machine relative to the at least one display device; and
causing, by the processor, the lighting component to initiate a first pattern at a timing based on the delay offset value, thereby synchronizing presentation of the first pattern with the animation.

17. The computer-implemented method of claim 16, further comprising causing, by the processor, a button deck of the electronic gaming machine to be illuminated in a second lighting pattern, the second lighting pattern selected based upon the animation and time synchronized with the animation.

18. The computer-implemented method of claim 16, further comprising causing, by the processor, a topper display of the electronic gaming machine to be illuminated in a second lighting pattern, the second lighting pattern selected based upon the animation and time synchronized with the animation.

19. The computer-implemented method of claim 16, further comprising causing, by the processor, a display device of a mechanical pushbutton of the electronic gaming machine to be illuminated in a second lighting pattern, the second lighting pattern selected based upon the animation and time synchronized with the animation.

20. The computer-implemented method of claim 16, further comprising:
- determining, by the processor, a first latency associated with causing the at least one display device of the at least one mechanical reel to display the animation;
- determining, by the processor, a second latency associated with causing the at least the portion of the edge lighting to be illuminated in the first lighting pattern; and
- delaying, by the processor, causing one of the display device of the at least one mechanical reel to display the animation or the at least the portion of the edge lighting to be illuminated in the first pattern based upon the first latency and the second latency, whereby the display device of the at least one mechanical reel is caused to begin display of the animation at substantially the same time that the at least the portion of the edge lighting is caused to be illuminated in the first lighting pattern.

* * * * *